(12) United States Patent
Lee

(10) Patent No.: US 6,809,935 B1
(45) Date of Patent: Oct. 26, 2004

(54) THERMALLY COMPLIANT PCB SUBSTRATE FOR THE APPLICATION OF CHIP SCALE PACKAGES

(75) Inventor: Jin-Yuan Lee, Hsin-chu (TW)

(73) Assignee: Megic Corporation, Hsin-Chu (TW)

( * ) Notice: Subject to any disclaimer, the term of this patent is extended or adjusted under 35 U.S.C. 154(b) by 0 days.

(21) Appl. No.: 09/684,519

(22) Filed: Oct. 10, 2000

(51) Int. Cl.7 .................................................. H05K 7/10
(52) U.S. Cl. .................. 361/783; 361/712; 361/779; 361/762; 257/698; 257/778; 174/259; 174/260
(58) Field of Search ................................. 361/783, 762, 361/765, 767, 779, 792, 795, 820, 676, 688, 687, 704, 712, 713, 760, 757, 746, 748; 257/698, 778; 174/259, 261, 117

(56) References Cited

U.S. PATENT DOCUMENTS

| | | | | |
|---|---|---|---|---|
| 5,450,283 A | * | 9/1995 | Lin et al. | 361/704 |
| 5,519,177 A | * | 5/1996 | Wang et al. | 174/256 |
| 5,741,575 A | * | 4/1998 | Asai et al. | 361/748 |
| 5,889,652 A | | 3/1999 | Turturro | 361/705 |
| 5,969,461 A | * | 10/1999 | Anderson et al. | 174/260 |
| 5,990,545 A | | 11/1999 | Schueller et al. | 257/697 |
| 6,031,282 A | | 2/2000 | Jones et al. | 257/692 |
| 6,041,495 A | | 3/2000 | Yoon et al. | 29/841 |
| 6,091,252 A | * | 7/2000 | Akram et al. | 324/755 |
| 6,211,052 B1 | * | 4/2001 | Farnworth | 438/614 |
| 6,217,988 B1 | * | 4/2001 | Yasue et al. | 174/258 |
| 6,373,717 B1 | * | 4/2002 | Downes et al. | 361/795 |

OTHER PUBLICATIONS

DiStefano et al., "Designing a Modular Chip–Scale Package Assembly Line", Circuit Assembly, Mar. 1977, (pages not numbered), (no date).

* cited by examiner

Primary Examiner—Randy W. Gibson
Assistant Examiner—Hung Bui
(74) Attorney, Agent, or Firm—George O. Saile; Stephen B. Ackerman; Rosemary L. S. Pike (57) ABSTRACT

A new method is provided for mounting a semiconductor on the surface of a Printed Circuit Board. A layer of Elastomer is deposifed on the surface face of the PCB, this layer of Elastomer makes the PCB into a thermally compliant PCB such that the thermal mismatch between the PCB and the semiconductor die that is mounted on the PCB is sharply reduced. Openings are created in the layer of Elastomer and electrical interfaces are created such that the PCB can be connected to the semiconductor die that is mounted on the PCB.

52 Claims, 3 Drawing Sheets

THERMALLY COMPLIANT PCB SUBSTRATE FOR THE APPLICATION OF CHIP SCALE PACKAGES

BACKGROUND OF THE INVENTION (1) Field of the Invention

The invention relates to the fabrication of integrated circuit devices, and more particularly, to a method of eliminating the thermal mismatch between silicon and a Printed Circuit Board substrate.

(2) Description of the Prior Art

Semiconductor device performance improvements are largely achieved by reducing device dimensions, a development that has at the same time resulted in considerable increases in device density and device complexity. These developments have resulted in placing increasing demands on the methods and techniques that are used to access the devices, also referred to as I/O capabilities of the device. This has led to new methods of packaging semiconductor devices whereby structures such as Ball Grid Array (BGA) devices and Column Grid Array (CGA) devices have been developed A Ball Grid Array (BGA) is an array of solderable balls placed on a chip carrier. The balls contact a printed circuit board in an array configuration where, after reheat, the balls connect the chip to the printed circuit board. BGA's are known with 40, 50 and 60 mils. spacings in regular and staggered array patterns. Due to the increased device miniaturization, the impact that device interconnects have on device performance and device cost has also become a larger factor in package development. Device interconnects, due to their increase in length in order to package complex devices and connect these devices to surrounding circuitry, tend to have an increasingly negative impact on the package performance. For longer and more robust metal interconnects, the parasitic capacitance and resistance of the metal interconnection increase, which degrades the chip performance significantly. Of particular concern in this respect is the voltage drop along power and ground buses and the RC delay that is introduced in the critical signal paths. In many cases the requirements that are placed on metal interconnects results in conflicting performance impacts. For instance, attempts to reduce the resistance by using wider metal lines result in higher capacitance of these wires. It is therefore the trend in the industry to look for and apply metals for the interconnects that have low electrical resistance, such as copper, while at the same time using materials that have low dielectric materials for insulation between interconnecting lines.

One of the more recent developments that is aimed at increasing the Input-Output (I/O) capabilities is the development of Flip Chip Packages. Flip-chip technology fabricates bumps (typically Pb/Sn solders) on Al pads on a semiconductor device, the bumps are interconnected directly to the package media, which are usually ceramic or plastic based. The flip-chip is bonded face down to the package medium through the shortest path. This technology can be applied not only to single-chip packaging, but also to higher or integrated levels of packaging in which the packages are larger while more sophisticated substrates can be used that accommodate several chips to form larger functional units.

The flip-chip technique, using an area array, has the advantage of achieving the highest density of interconnection to the device and a very low inductance interconnection to the package. However, pre-testability, post-bonding visual inspection, and TCE (Temperature Coefficient of Expansion) matching to avoid solder bump fatigue are still challenges. In mounting several packages together, such as surface mounting a ceramic package to a plastic board, the TCE mismatch can cause a large thermal stress on the solder-lead joints that can lead to joint breakage caused by solder fatigue from temperature cycling operations.

In general, Chip-On-Board (COB) techniques are used to attach semiconductor die to a printed circuit board, these techniques include the technical disciplines of flip chip attachment, wirebonding, and tape automated bonding (TAB). Flip chip attachment consists of attaching a flip chip to a printed circuit board or to another substrate. A flip chip is a semiconductor chip that has a pattern or arrays of terminals that is spaced around an active surface of the flip chip that allows for face down mounting of the flip chip to a substrate.

Generally, the flip chip active surface has one of the following electrical connectors: BGA (wherein an array of minute solder balls is disposed on the surface of the flip chip that attaches to the substrate); Slightly Larger than Integrated Circuit Carrier (SLICC) (which is similar to the BGA but having a smaller solder ball pitch and diameter than the BGA); a Pin Grid Array (PGA) (wherein an array of small pins extends substantially perpendicularly from the attachment surface of a flip chip, such that the pins conform to a specific arrangement on a printed circuit board or other substrate for attachment thereto. With the BGA or SLICC, the solder or other conductive ball arrangement on the flip chip must be a mirror image of the connecting bond pads on the printed circuit board so that precise connection can be made. The flip chip is bonded to the printed circuit board by refluxing the solder balls. The solder balls may also be replaced with a conductive polymer. With the PGA, the pin arrangement of the flip chip must be a mirror image of the recesses on the printed circuit board. After insertion, soldering the pins in place generally bonds the flip chip.

Figure 1:
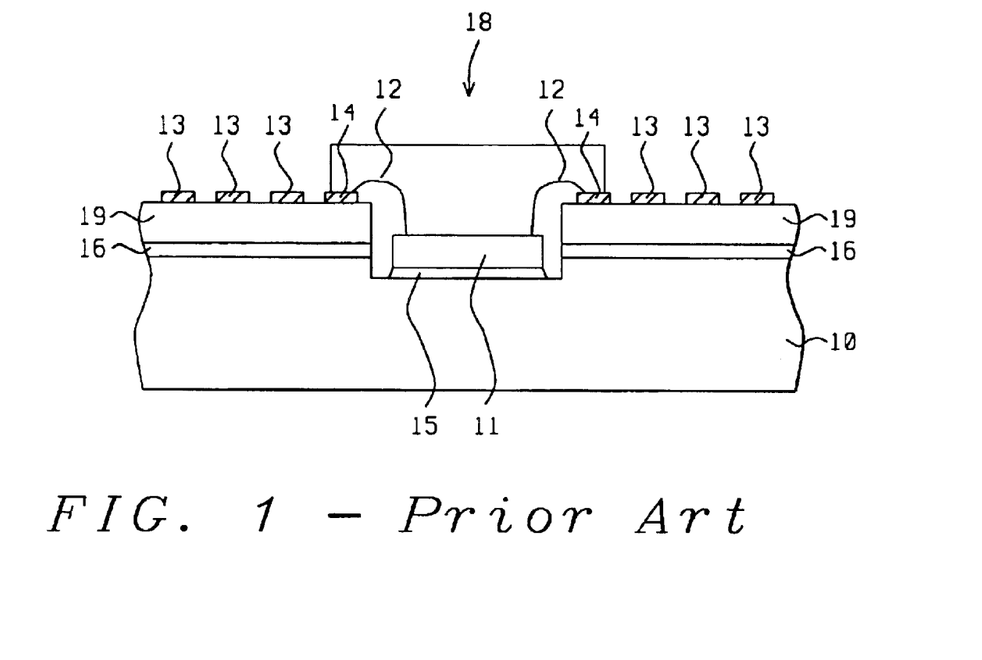
FIG. 1 shows a cross section of a first Prior Art BGA package.

A Prior Art method of packaging a BGA chip is shown in FIG. 1. The BGA chip 11 is mounted in a cavity 18 that is provided in the surface of a BGA substrate or a substrate 10, substrate 10 has a surface that is electrically conductive. The BGA chip 11 is centered with respect to the substrate 10, whereby the contact points of the semiconductor device 11 are closely spaced around the periphery of the die 11. Cavity 18 is provided in the substrate 10 for the mounting of the Integrated Circuit (IC) chip 11. The top surface of the IC chip 11 is in close physical contact with the substrate 10 via a thin adhesive layer 15, typically of thermally conductive epoxy, that is deposited over the top surface of cavity 18. The IC die 11 is attached to the substrate 10 by means of this layer 15, providing a path of heat conductivity between the semiconductor die. 11 and the substrate 10. The adhesive layer 15 is cured after the IC die 11 has been inserted into cavity 18. The contact points of the die 11 are conductively bonded, using wire-bonding techniques, to the substrate layer 19.

The bond wires 12 are shown here as applied for the connection of the IC die 11 to a top layer 13 of an interconnect substrate 19. The interconnect substrate 19 can contain multiple layers of interconnect lines and contact pads. The interconnect substrate 19 is connected to the underlying substrate 10 by means of layer 16, which is typically a layer of adhesive material. This establishes the necessary mechanical support for the wire bonding operation. The interconnect substrate 19 can further contain a mechanical stiffener to provide rigidity to the interconnect substrate 19. The upper layer of the interconnect substrate 19 contains (metal, for instance copper) traces 13 to which contact balls (not shown in FIG. 1) can be connected for further interconnects to surrounding circuitry or functional elements. Wires 12 provide a wire bond connection between contact points on the surface of the IC die 11 and copper traces 14 that are part of the interconnect substrate 19. For the connection of the upper layer of the interconnect substrate 19 to connecting solder balls, a solder mask layer (not shown in FIG. 1) with openings is deposited over the surface of the substrate layer 19. The openings that are created in the solder mask provide solder connections between the metal traces 13 and the contact balls.

FIG. 1 also shows how the IC die 11 is encapsulated using an encapsulation material that is syringe dispensed to surround the die 11 forming the encapsulation layer 17. It must be noted that this layer not only surrounds the IC die 11, but also covers the bond wires 12. The encapsulation layer 17 is cured after injection.

The Prior Art package that is shown in FIG. 1 is of a somewhat elaborate design in that it has a heat sink in which a cavity is provided for the insertion of a semiconductor die, a substrate that may contain multiple interconnect layers and methods of encapsulating the mounted semiconductor die. Simpler methods for mounting a semiconductor die can be used whereby the die is mounted directly on the surface of a Printed Circuit Board (PCB) while layers of metal interconnect within the PCB are used to connect the I/O connections of the mounted die to surrounding circuitry. In most applications of this kind, the die is still provided with contact balls, these contact balls rest directly on the surface of the PCB and are connected to electrical points of contact that are opened in the surface of the PCB.

Figure 2:
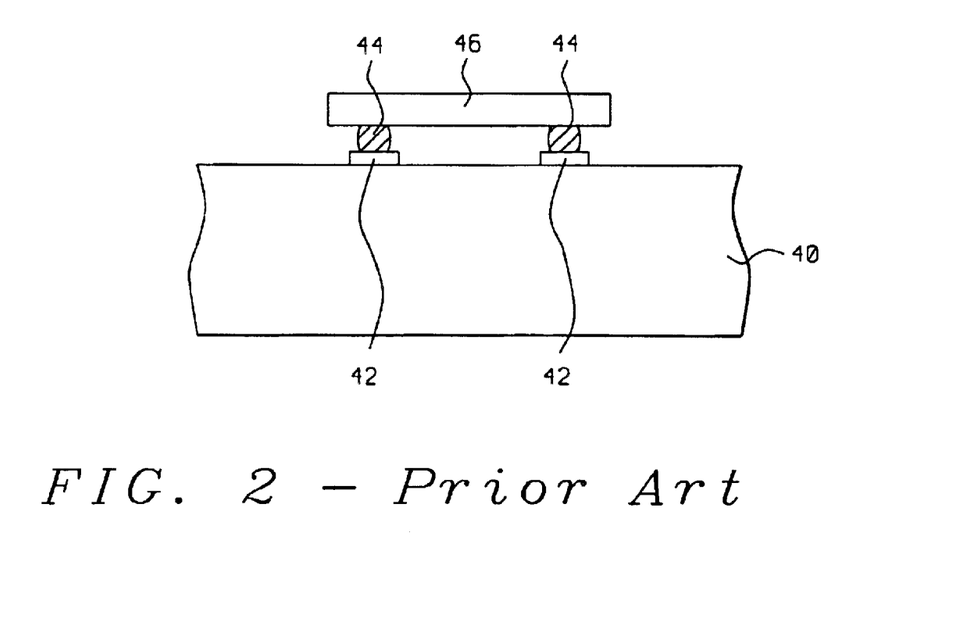
FIG. 2 shows a cross section of a second Prior Art BGA package.

One such application is shown in FIG. 2, where a semiconductor die 46 is surface mounted on a Printed Circuit Board (PCB) 40. A layer 42 of top metal is provided on the surface of the PCB 40, the die 46 is connected to the layer 42 of top metal via the BGA contact balls 44. It is clear that the top layer 42 of metal is connected to one or more layers of interconnect metal that are within the body of the PCB 40, the top layer of metal 42 can be a layer of metal that has been deposited on the surface of the PCB and patterned and etched to provide to desired interconnect pattern on the surface of the PCB 40. It is also possible to use metal pads that are part of the top layer of metal within the PCB and that have been exposed for interconnect to the semiconductor die 46. The die 46 contains mostly silicon while numerous other materials may have been added to the silicon die in order to create a functional semiconductor device. One of the more serious problems that is encountered in the method that is shown in FIG. 2 is that there is a significant thermal mismatch between the PCB 40 and the silicon that is predominantly contained in die 46. As already pointed out, a severe mismatch in the TCE (Temperature Coefficient of Expansion) between the silicon die and the underlying PCB causes severe solder bump fatigue during the unavoidable thermal cycles to which the package is subjected. In mounting several packages together, such as surface mounting a ceramic package to a plastic board, the TCE mismatch can cause a large thermal stress on the solder-lead joints, this can lead to joint breakage caused by solder fatigue from temperature cycling operations. Conventional methods apply a thermal compliant material on the surface of the silicon die in order to alleviate the effect of thermal stress.

This process however incurs significant manufacturing cost and is therefore to be avoided. The invention addresses a method that allows for the elimination of thermal stress between the mounted die and the underlying PCB, while not incurring the expense of providing a layer of thermal compliant material on the surface of the die that conventionally is used to alleviate thermal stress.

Numerous other examples of die attachment and methods of packaging semiconductor die are readily available in the literature of the art. Some further detail will be provided relating to these various methods in the below referenced and related US Patents.

U.S. Pat. No. 6,031,282 (Jones et al.) shows an IC package with an elastomer on a PCB and die pads. This Patent shown an example of Prior Art packages wherein the semiconductor die is mounted inside a lower part of the package, outer leads run from the die to connection points on the surface of a FCB on which the package is mounted. The die is protected and the package is closed by an upper part of the package. As an alternate example of Prior Art packaging, this Patent shows a BGA package that strongly resembles the previously cited Prior Art example of FIG. 1. In this case, the semiconductor die is mounted on the surface of an underlying PCB. The Patent of this invention provides for a Chip Scale Package wherein the package size is equivalent to the size of the die that is mounted in the package, providing advantages of packaging high density semiconductor devices. This package does not make use of Elastomer as an isolation material.

U.S. Pat. No. 6,041,495 (Yoon et al.) shows a PCB with an elastomer and chip mount. This Patent shows a number of Prior Art application using PCB's for the mounting of BGA devices, these devices are mounted either on a top or a bottom surface of the PCB. This Patent makes use of mounting a semiconductor die on the surface of the PCB, a metal plate is used as part of the package. This Patent also makes use of a flexible circuit board for the mounting of semiconductor devices, this application uses polyimide tape that is attached to the flexible circuit board.

U.S. Pat. No. 5,889,652 (Turturro) shows a PCB and a substrate with an elastomer therebetween. This patent differentiates between a contact portion of the package and a bond portion. The two (contact and bond) portions of the package are interconnected via a flexible portion (elastomer). This allows relative movement between the package (on which the die is mounted) and the PCB, in this manner reducing thermal and mechanical stress on the solder joints.

U.S. Pat. No. 5,990,545 (Schueller et al.) shows a SCBGA with a PCB and direct chip attach with an elastomer to compensate for the thermal mismatch of the PCB and the die. A nonpolymer layer or support structure is positioned between the semiconductor die and the underlying substrate reducing effects of thermal stress.

Distefano et al., "Designing a Modular Chip Scale Package Assembly Line", Circuit Assembly, Mar. 1977, (pages not numbered). This article focuses on the Chip Scale Package (CSP) and provides methods and procedures for relatively easy assembly of CSP's.

SUMMARY OF THE INVENTION

A principle objective of the invention is to eliminate thermal stress between a mounted semiconductor die and an underlying Printed Circuit Board.

Another objective of the invention is to provide a cost effective method to eliminate thermal stress between a mounted semiconductor die and the underlying Printed Circuit Board.

Yet another objective of the invention is to provide a method that allows for direct die attachment to a surface of a Printed Circuit Board without incurring negative results of thermal mismatch between the semiconductor die and the Printed Circuit Board.

In accordance with the objectives of the invention a new method is provided to mount a semiconductor on the surface of a Printed Circuit Board. A layer of Elastomer is deposited on the surface of the PCB, this layer of Elastomer makes the PCB into a thermally compliant PCB such that the thermal mismatch between the PCB and the semiconductor die that is mounted on the PCB is sharply reduced. Openings are created in the layer of Elastomer and electrical interfaces are created such that the PCB can be connected to the semiconductor die that is mounted on the PCB.

BRIEF DESCRIPTION OF THE DRAWINGS

FIG. 4 shows the difference in connecting layers of conductors, as follows:FIG.

FIG. 5 shows a number of options for the application of Elastomer in accordance with the process of the invention, that is:

DESCRIPTION OF THE PREFERRED EMBODIMENTS

Figure 3:
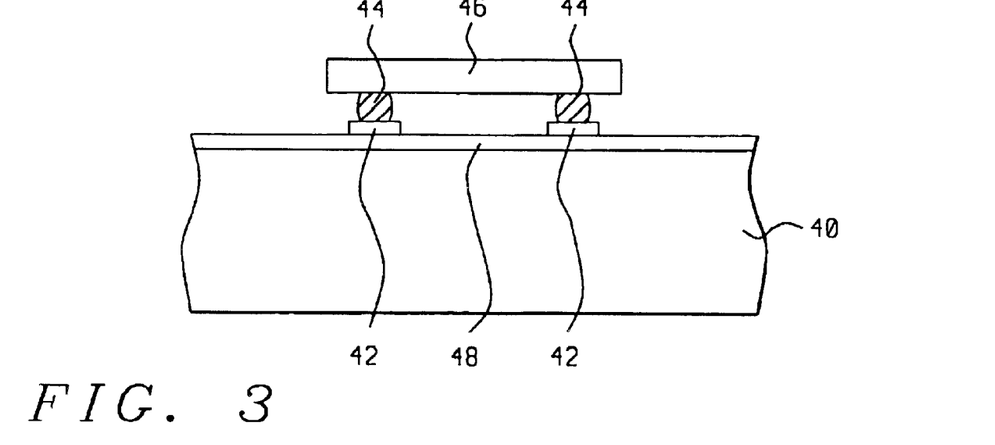
FIG. 3 shows a cross section of the BGA package of the invention.

Referring now specifically to FIG. 3, there is shown a cross section of the BGA package of the invention. The semiconductor device 46 has been mounted on the surface of a substrate 40, in most cases this substrate 40 will be a Printed Circuit Board (PCB) but the application of the invention is not limited to the use of a PCB. Points of electrical contact (not shown in FIG. 3) are provided in the lower surface of the semiconductor device 46. Solder balls 44 are connected to die 46 by means of solder flow (or any other means that can be used for the connection of solder balls to a semiconductor surface). Solder balls 44 are the interface between the contact points that are provided in the surface of chip 46 and the metal traces 42 that are provided in the surface of the substrate 40. Prior to the establishment of this electrical interface, a layer 48 of Elastomer has been deposited over the surface of substrate 40. Openings are created in this layer of Elastomer whereby these created openings align with underlying points of electrical contact in the surface of substrate 40. The methods that are used for the creation of the openings in the layer of Elastomer can comprise methods of laser technology or conventional methods of photolithography. The in this manner exposed contact pads in the surface of the substrate 40 can be electroless or electro plated, after which the contact balls are connected to the contact pads in the surface of substrate 40.

The layer 48 of Elastomer can be deposited using a laminating process or a liquid depositing process.

The above-indicated sequence of processing steps can be summarized as follows:

cleaning the surface of substrate 40 with a DIW rinse or any other method of surface cleaning, coating of the substrate 40 with a layer 48 of Elastomer or any other thermally compliant material; the layer 48 of Elastomer is created on the surface of substrate 40, and creating vias or contact openings in the layer 48 for electrical connections to the substrate 40.

The methods that are used for the creation of vias or contact openings in the deposited layer of Elastomer depends on whether methods of PCB or methods of Build Up Board are being used. This difference is further explained using FIG. 4, which highlights this difference in the laminate layer 48 (FIG. 3) using the conventional PCB approach and the "Build Up Board" approach.

Figure 4A:
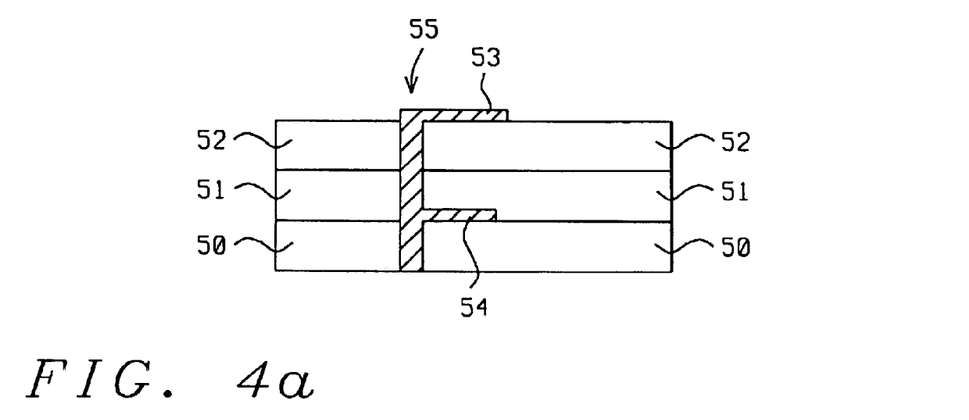
FIG. 4a shows the PCB method of interconnecting conductive pads.
Figure 4B:
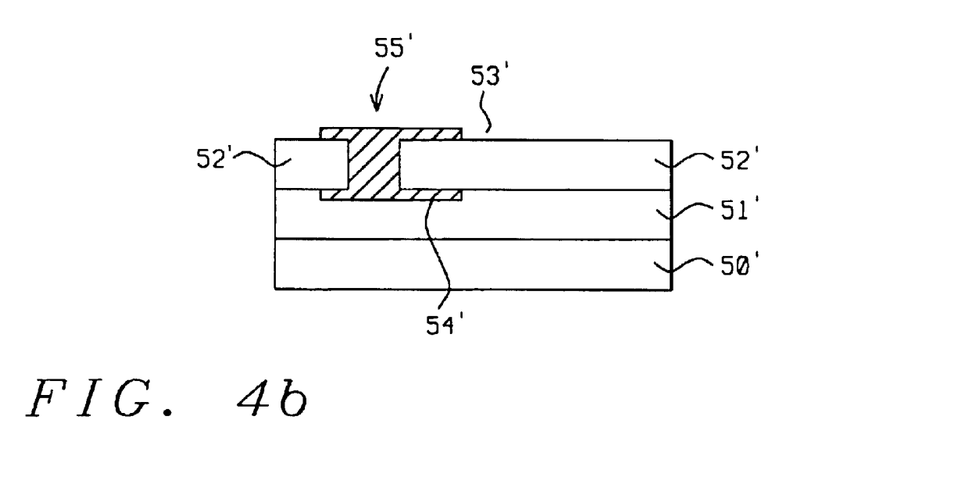
FIG. 4b shows the Build Up Board method of interconnecting conductive pads.

FIG. 4a refers to the PCB approach and shows how three layers 50, 51 and 52 have been successively deposited on a PCB substrate (not shown in FIGS. 4a and 4b). A first conductive pattern 54 has been created on the surface of layer 50 after which layers 51 and 52 are deposited. A second conductive pattern 53 is created on the surface of layer 52, it is required that the two patterns 54 and 53 are interconnected. Using the PCB approach, this interconnection is achieved by means of a "through hole" 55 that is create through all three layers 50, 51 and 52, the through hole 55 is in contact with the conductive pads 54 and 53. By filling the through hole 55 with a conductive material, the electrical contact between conductive pads 54 and 53 is established. Methods used for the creation of through holes comprise methods of photolithography.

FIG. 4b refers to the Build Up Board approach and shows how three layers 50', 51' and 52' have been successively deposited over a semiconductor surface. A first conductive pattern 54' has been created in the surface of layer 51' after which layer 52' is deposited. A second conductive pattern 53' is created on the surface of layer 52', it is required that the two pads 54' and 53' are interconnected. Using the Build Up Board approach, this interconnection is achieved by means of via 55' that is created in layer 52', the via 55' is in contact with the conductive pads 54' and 53'. By filling the via 55' with a conductive material, the electrical contact between conductive pads 54' and 53' is established. Methods used for the creation of vias can comprise methods of laser drilling or photo/etching process.

It must be noted that the surface of each of the layers that are created (and over which a layer of metal is to be deposited for the formation of metal patterns) can be treated, using methods of etching or swelling, to roughen the surface of this layer and to therewith promote adhesion for the subsequent electroless metal (such as copper) deposition.

The deposition of the layers of metal on the surface of the layers of Elastomer can be preceded by electroless seeding of the surface of the layer after which electroplating of the surface deposits a layer of metal. The deposited layer of metal is then masked and etched to create the metal pattern on the surface of the layer. A layer of Elastomer can be deposited using a spin-on coating, printing coating, spray coating, laminating process and a liquid depositing process.

FIG. 5 further describes some of the different approaches that can be used for the application of the layer of Elastomer.

Figure 5A:
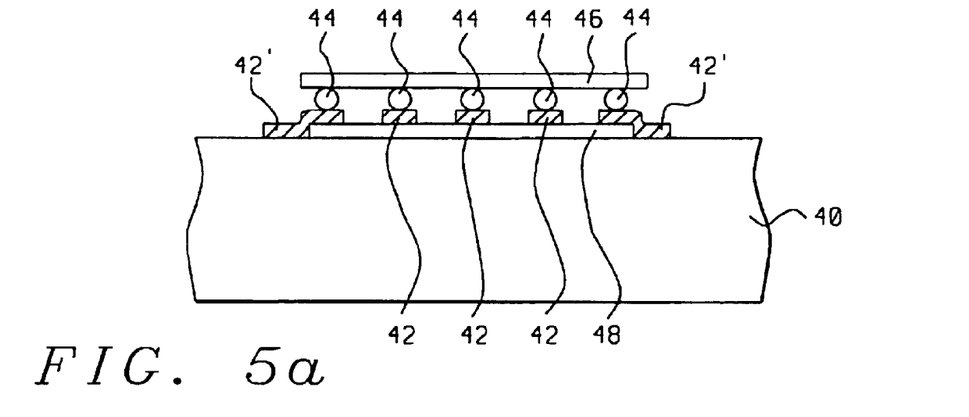
FIG. 5a shows an application where one solid layer of Elastomer is applied over the surface of a substrate, metal traces on the surface of the deposited layer of Elastomer provide for the interconnection of devices.

FIG. 5a shows an application where one solid layer 48 of Elastomer is created over the surface of substrate 40. The layer 48 of Elastomer is essentially applied underneath the die 46, metal traces 42 have been created on the surface of layer 48 for interconnect points to the solder bumps 44 of flip chip 46. The metal traces can be created such that they are located on the surface of layer 48 or they can be created at the edge of layer 48, such as metal traces 42'. For the configuration that is shown in FIG. 5a, no contact openings are created in layer 48 of Elastomer, the interconnect lines and contact 42/42' pads 42/42' are created on the surface of layer 48.

The method that is shown in FIG. 5a, that is the creation of metal traces 42/42' on the surface of the created layer 48 of Elastomer, can be further enhanced by the deposition of a layer of dielectric over the pattern of metal traces 42. A solder mask (not shown in FIG. 5a) can be deposited over the layer of dielectric, patterning of the layer of dielectric creates openings in the layer of dielectric that align with the underlying metal traces 42. The solder bumps 44 of the semiconductor device 46 can now be aligned with and connected to the metal traces 42, solder reflow will connect the semiconductor device 46 to the metal traces 42. This extension of the process of the invention provides a layer of dielectric being interposed between and partially overlying the metal traces 42 for improved isolation and protection.

Figure 5B:
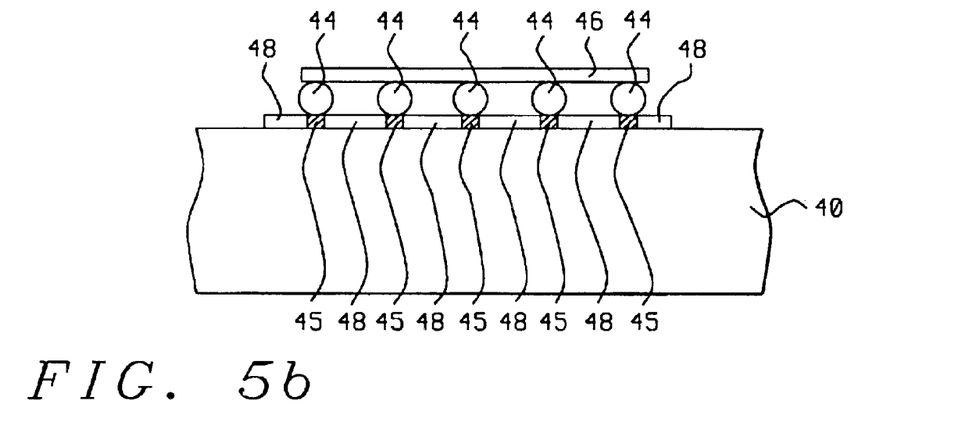
FIG. 5b shows an application where the applied Elastomer has been divided in multiple sub-sections that remain deposited on the surface of a substrate, openings through the layer of deposited Elastomer provide for the interconnection of devices.

FIG. 5b shows an application where openings 45 are created in the created Elastomer, these openings are filled with metal or any other conductive material to form the interconnect between the points of electrical contact in the surface of substrate 40 and the solder bumps 44 of the flip chip 46.

The method that is used to create the electrical contacts 45 between contact points in the surface of the substrate 40 (not shown in FIG. 5) and the contact balls (solder bumps) 44 of IC die 46 can be either the PCB method or the Build Up Board method that has previously been explained using FIG. 4. One or more depositions of a layer of Elastomer may be followed (using the PCB approach) by creating patterns of interconnect lines or contact pads. After all required layers of Elastomer have been deposited, on opening is created through the layers of Elastomer that interconnects all the interconnect lines and contact pads that are required to be interconnected. For the Build Up Board method this is slightly more complex in that vias must be created after each step of Elastomer lamination, these vias must be created where interconnects between overlying points of contact are required. Multiple overlying vias can in this manner be created resulting in the ability to create a layer of Elastomer that has been deposited using multiple laminations of the Elastomer.

Figure 5C:
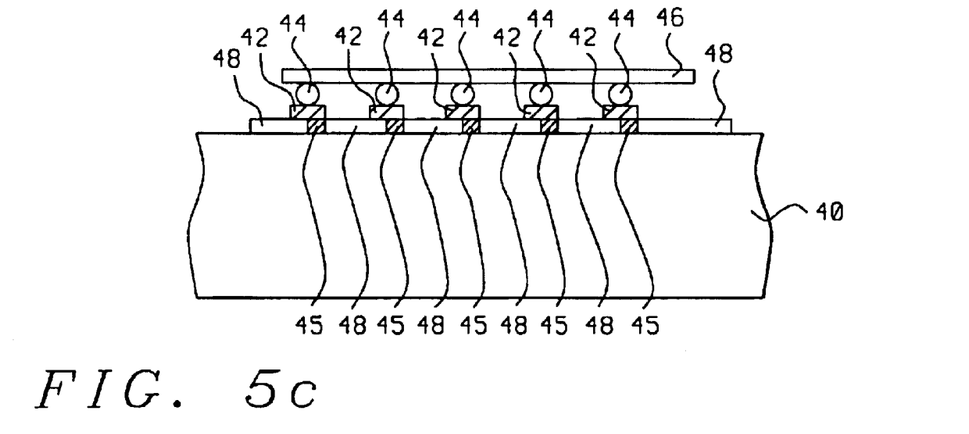
FIG. 5c shows the use of Elastomer where a combination of metal traces (on the surface of the deposited layer of Elastomer) and openings (through the layer of deposited Elastomer) provide for the interconnection of devices.

FIG. 5c shows the use of Elastomer whereby the conductive interfaces are created by combining the methods that are shown in FIGS. 5a and 5b. The interconnects 45 are created through the layer 48 of Elastomer and can be extended (using conductive traces 42) in any direction and over any length over the surface of the thermal stress relieve layer 48 of Elastomer, thereby forming an interconnect network 42 on the surface of layer 48 of Elastomer. Metal traces 42 contact solder bumps 44 of the flip chip 46.

It is clear from the above highlighted examples that the application of a layer of Elastomer over the surface of a substrate lends itself to many variations. The indicated examples have been limited to show the mounting of only one semiconductor device on the surface of a substrate. There is no need to adhered to this limitation in actual applications of the method of the invention, multiple semiconductor devices can be mounted on a surface of a substrate whereby the layer of Elastomer may be one layer or may be applied over only those parts of the surface of the substrate where this application is required or provides optimum results of thermal interface. Any of the variations of the lamination of the layer of Elastomer that have been highlighted in FIG. 5 can further be applied in applications where multiple chips are mounted on the surface of a substrate.

The difference that can be achieved in the layer of Elastomer that is deposited using methods of lamination (or spin-coated, printing coated, spray coated, etc., that is: laminated or liquid deposited) over a semiconductor surface is clearly highlighted by the examples that have been discussed under FIGS. 4a and 4b. From these examples it is clear that a number of first layers of Elastomer can be deposited first, a first conductive pattern can be created on the surface of the last layer of Elastomer (that belongs to the first layers of Elastomer), additional second layers of Elastomer can then be created over the first conductive pattern and the layer of Elastomer on the surface of which the first conductive pattern has been created followed by the creation of a second conductive pattern. The Build Up Method of interconnecting the conductive patterns allows for the creation of second conductive pads on the last layer of Elastomer by the creation of vias. Additional layers of Elastomer may as yet be deposited over the second pattern of conductive vias allowing for numerous layers of Elastomer.

A similar approach can be followed using the PCB method of interconnecting overlying conductive patterns whereby the overlying conductive patterns that align with each other are interconnected by through holes.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A structure for providing thermal stress relieve for packages that are used for the mounting of semiconductor devices, comprising:

a circuit board on which at least one point of electrical contact has been provided;

one or more layers of thermal stress relieve material created on said circuit board;

one or more semiconductor devices for mounting on said circuit board, said semiconductor devices having been provided with points of electrical contact; and electrical contact between said point of electrical contact provided on said circuit board and said points of electrical contact provided in said semiconductor devices, said electrical contact having been established using Printed Circuit Board technology or Build Up Board technology, said Printer Board technology comprising creating one or more openings in said one or more layers of thermal stress relieve material aligned with said at least one point of electrical contact provided on said circuit board, by depositing a layer of conductive material over said created layers of thermal stress relieve material, including said one or more openings and by creating an upper layer of interconnect lines and contact pads formed by patterning said layer of conductive material on said layer of said thermal stress relieve material;

a layer of dielectric deposited over said upper layer of interconnect lines, including said exposed thermal stress relieve material;

a solder mask deposited over said layer of dielectric; and an array of conductive pads in the layer of dielectric created by patterning said layer of dielectric, said conductive pads having been connected to at least one of said points of electrical contact provided on said circuit board, said conductive pads further being points of electrical contact for said semiconductor devices.

2. The structure of claim 1, additionally comprising:

said semiconductor devices having been positioned above said circuit board such that said array of conductive pads in the layer of dielectric aligns and is in contact with said points of electrical contact of said semiconductor devices; and said array of conductive pads in the layer of dielectric having been connected with said points of electrical contact for said semiconductor devices.

3. The structure of claim 1 wherein said Build Up Board technology comprises interconnecting a first pattern of interconnect lines and contact pads to a second pattern of interconnect lines and contact pads, said first pattern of interconnect lines and contact pads having being created on a first layer of thermal stress relieve material, said second pattern of interconnect lines and contact pads having been created on a second layer of thermal stress relieve material.

4. The structure of claim 3, said Build Up Board technology having been applied one or more times during creating a layer of thermal stress relieve material on said circuit board, having created multiple overlying vias interconnecting multiple layers of interconnect lines and contact pads.

5. The structure of claim 3, additionally comprising:

a layer of dielectric deposited over said second layer of conductive material, including said second layer of thermal stress relieve material;

a solder mask deposited over said layer of dielectric; and an array of conductive pads in the layer of dielectric having been created by patterning said layer of dielectric, said conductive pads having been connected to at least one of said points of electrical contact provided on said circuit board, said conductive pads further being points of electrical contact for said one or more semiconductor devices.

6. The structure of claim 5, additionally comprising:

said semiconductor devices having been positioned above said circuit board such that said array of conductive pads in the layer of dielectric aligns and is in contact with said points of electrical contact of said semiconductor devices; and said array of conductive pads in the layer of dielectric having been connected with said points of electrical contact for said semiconductor devices.

7. The structure of claim 1, said semiconductor devices being flip chip devices having been provided with solder bumps.

8. The structure of claim 1, wherein said circuit board is a Printed Circuit Board.

9. The structure of claim 1, wherein said thermal stress relieve material comprises Elastomer or any other Thermal Compliant material.

10. The structure of claim 1 with additionally comprising etching or swelling one or more of said created layers of thermal stress relieve material, thereby having roughened said created layers and thereby enhancing adhesion for a subsequent electroless metal deposition.

11. The structure of claim 1 with additionally said one or more layers of thermal stress relieve material having been cured.

12. The structure of claim 1, electrical contact between said point of electrical contact provided in said circuit board and said points of electrical contact provided in said semiconductor devices having been established by providing contact pads on said created layers of thermal stress relieve material, said contact pads having been connected to at least one of said points of electrical contact provided on said circuit board, said contact pads further being points of electrical contact for said semiconductor devices.

13. The structure of claim 1, electrical contact between said point of electrical contact provided in said circuit board and said points of electrical contact provided in said semiconductor devices having been established by providing at least one conducting interconnect through said created layers of thermal stress relieve material, said conducting interconnects having been connected to at least one of said points of electrical contact provided on said circuit board using interconnect methods of PCB technology or Build Up Board technology, said conducting interconnects further being points of electrical contact for said semiconductor devices.

14. The structure of claim 1, electrical contact between said point of electrical contact provided in said circuit board and said points of electrical contact provided in said semiconductor devices having been established by providing at least one contact pad on said created layers of thermal stress relieve material in addition to having provided at least one conducting interconnect through said created layers of thermal stress relieve material, said contact pads on said created layers of thermal stress relieve material having been connected to said at least one conducting interconnect through said created layers of thermal stress relieve material, said conducting interconnects having been connected to at least one of said points of electrical contact points provided on said circuit board, said contact pads on said created layers of thermal stress relieve material being points of electrical contact for said semiconductor devices.

15. The structure of claim 14 wherein at least one contact pad on said created layers of thermal stress relieve material comprises:

a patterned layer of conducting material over said created layer of thermal stress relieve material, comprising a pattern of interconnect lines on said created layer of thermal stress relieve material;

a layer of dielectric deposited over said pattern of interconnect lines;

a solder mask deposited over said layer of dielectric; and said layer of dielectric having been patterned, exposing an array of conductive pads in the layer of dielectric, said conductive pads having been connected to at least one of said points of electrical contact provided on said circuit board, said conductive pads further being points of electrical contact for said semiconductor devices.

16. The structure of claim 15, additionally comprising:

said semiconductor devices having been positioned above said circuit board such that said array of conductive pads in the layer of dielectric aligns and is in contact with said points of electrical contact of said semiconductor devices; and said array of conductive pads in the layer of dielectric having been connected with said points of electrical contact for said semiconductor devices.

17. The structure of claim 1 wherein said Build Up Board technology comprises interconnecting a first pattern of interconnect lines and contact pads to a second pattern of interconnect lines and contact pads, said first pattern of interconnect lines and contact pads being created on a BGA surface, comprising:

a semiconductor surface having been provided with points of electrical contact in its surface;

a layer of thermal stress relieve material having been created on said semiconductor surface;

vias having been created in said layer of stress relieve material, said vias overlying said points of electrical contact provided in said semiconductor surface;

a layer of conductive material having been deposited on said layer of stress relieve material, including said vias, connecting said layer of conductive material to electrical contact provided in said semiconductor surface; and said layer of conductive material having been patterned, having created a pattern of interconnect lines or contact pads, exposing said created layer of thermal stress relieve material.

18. The structure of claim 17 wherein said semiconductor surface is the surface of a BGA substrate.

19. The structure of claim 17, said Build Up Board technology having been applied one time during said step of creating a layer of thermal stress relieve material on said semiconductor surface, having created a first created layer of thermal stress relieve material on said semiconductor surface.

20. The structure of claim 17, additionally comprising:

a layer of dielectric deposited over said pattered layer of conductive material, including said exposed thermal stress relieve material;

a solder mask deposited over said layer of dielectric; and an array of conductive pads in the layer of dielectric created by patterning said layer of dielectric, said conductive pads having been connected to at least one of said points of electrical contact provided on said circuit board, said conductive pads further being points of electrical contact for said semiconductor devices.

21. The structure of claim 20, additionally comprising:

said semiconductor devices having been positioned above said circuit board such that said array of conductive pads in the layer of dielectric aligns and is in contact with said points of electrical contact of said semiconductor devices; and said array of conductive pads in the layer of dielectric having been connected with said points of electrical contact for said semiconductor devices.

22. A method of providing thermal stress relieve for packages used for mounting semiconductor devices, comprising steps of:

providing a circuit board having at least one point of electrical contact;

forming one or more layers of thermal stress relieve material on said circuit board;

providing one or more semiconductor devices for mounting on said circuit board, said one or more semiconductor devices having been provided with points of electrical contact; and establishing electrical contact between said at least one point of electrical contact provided on said circuit board and said points of electrical contact provided in said semiconductor devices, said establishing electrical contact between said at least one point of electrical contact provided on said circuit board and said points of electrical contact provided in said semiconductor devices comprising Printed Circuit Board technology or Build Up Board technology, said Printed Circuit Board technology comprising:

(i) creating one or more openings in said created layers of thermal stress relieve material whereby said one or more openings align with one or more overlying points of electrical contact on one or more created layers of said thermal stress relieve material;

(ii) depositing a layer of conductive material over said created layers of thermal stress relieve material, including said openings;

(iii) patterning said layer of conductive material, forming a upper layer of interconnect lines and contact pads on said created one or more layers of said thermal stress relieve material, exposing the surface of said thermal stress relieve material;

depositing a layer of dielectric over said upper layer of interconnect lines, including said exposed thermal stress relieve material;

depositing a solder mask over said layer of dielectric; and patterning said layer of dielectric, exposing an array of conductive pads in the layer of dielectric, said conductive pads having been connected to at least one of said at least one point of electrical contact provided on said circuit board, said conductive pads further being points of electrical contact for said one or more semiconductor devices.

23. The method of claim 22 with additional steps of:

positioning said semiconductor devices above said circuit board, said array of conductive pads in the layer of dielectric being aligned and in contact with said points of electrical contact of said semiconductor devices; and connecting said array of conductive pads in the layer of dielectric with said points of electrical contact for said semiconductor devices by thermal reflow.

24. The method of claim 22 wherein said Build Up Board technology comprises interconnecting a first pattern of interconnect lines and contact pads to a second pattern of interconnect lines and contact pads, said first pattern of interconnect lines and contact pads being created on an underlying or first layer of thermal stress relieve material, comprising steps of:

depositing a first layer of conductive material on a first layer of thermal stress relieve material;

patterning said first layer of conductive material, creating a first pattern of interconnect lines or contact pads;

creating a second layer of thermal stress relieve material on said first layer of thermal stress relieve material including said first pattern of interconnect lines or contact pads;

creating vias in said second layer of stress relieve material, said vias overlying interconnect lines or contact pads of said first pattern;

depositing a second layer of conductive material on said second layer of stress relieve material, including said vias, connecting said second layer of conductive material to said first pattern of interconnect lines or contact pads; and patterning said second layer of conductive material, creating a second pattern of interconnect lines or contact pads, exposing said created second layer of thermal stress relieve material.

25. The method of claim 24 wherein said creation of vias comprises methods of lithographic etching or laser drilling.

26. The method of claim 24, said Build Up Board technology being applied one or more times during said step of creating a layer of thermal stress relieve material on said circuit board, creating multiple overlying vias interconnecting multiple layers of interconnect lines and contact pads.

27. The method of claim 24 wherein said depositing a first layer of conductive material comprises steps of electroless seeding followed by electroplating of said first layer of said thermal stress relieve material.

28. The method of claim 24 wherein said depositing a second layer of conductive material comprises steps of electroless seeding followed by electroplating of said created second layer of said thermal stress relieve material, said step of electroless seeding followed by electroplating being performed after said creation of vias in said second layer of thermal stress relieve material.

29. The method of claim 24 with additional steps of:
depositing a layer of dielectric over said second layer of conductive material, including said exposed second layer of thermal stress relieve material;
depositing a solder mask over said layer of dielectric; and
patterning said layer of dielectric, exposing an array of conductive pads in the layer of dielectric, said conductive pads having been connected to at least one of said points of electrical contact provided on said circuit board, said conductive pads further being points of electrical contact for said one or more semiconductor devices.

30. The method of claim 29 with additional steps of:
positioning said semiconductor devices above said circuit board, said array of conductive pads of said second pattern of interconnect lines or contact pads being aligned and in contact with said points of electrical contact of said semiconductor devices; and
connecting said array of conductive pads of said second pattern of interconnect lines or contact pads with said points of electrical contact for said semiconductor devices by thermal reflow.

31. The method of claim 22, said semiconductor devices being flip chip devices having been provided with solder bumps.

32. The method of claim 22 wherein said circuit board is a Printed Circuit Board.

33. The method of claim 22 wherein said thermal stress relieve material comprises Elastomer or any other Thermal Compliant material.

34. The method of claim 22 wherein said creating one or more openings in said created layers of thermal stress relieve material comprises methods of photolithography.

35. The method of claim 22 wherein said depositing a layer of conductive material over said created layers of thermal stress relieve material comprises steps of electroless seeding followed by electroplating of said created layers of said thermal stress relieve material.

36. The method of claim 22 with an additional step of etching or swelling one or more of said created layers of thermal stress relieve material, thereby roughening said created layers, enhancing adhesion for a subsequent electroless metal deposition, said additional step being performed after said step of creating a layer of thermal stress relieve material.

37. The method of claim 22 with an additional step of curing one or more of said created layers of thermal stress relieve material, said additional step being performed after said step of creating a layer of thermal stress relieve material.

38. The method of claim 37 wherein said curing comprises thermal curing technology.

39. The method of claim 37 wherein said curing comprises E-beam curing technology.

40. The method of claim 37 wherein said curing comprises UV curing technology.

41. The method of claim 22 wherein establishing electrical contact between said at least one point of electrical contact provided on said circuit board and said points of electrical contact provided in said semiconductor devices is providing contact pads on said created layers of thermal stress relieve material, said contact pads having been connected to at least one of said points of electrical contact provided on said circuit board, said contact pads further being points of electrical contact for said semiconductor devices.

42. The method of claim 22 wherein establishing electrical contact between said at least one point of electrical contact provided on said circuit board and said points of electrical contact provided in said semiconductor devices is providing at least one conducting interconnect through said created layers of thermal stress relieve material, said conducting interconnects having been connected to at least one of said points of electrical contact provided on said circuit board using PCB technology or Build Up Board technology, said conducting interconnects further being points of electrical contact for said semiconductor devices.

43. The method of claim 22 wherein establishing electrical contact between said at least one point of electrical contact provided on said circuit board and said points of electrical contact provided in said semiconductor devices is providing at least one contact pad on said layers of thermal stress relieve material in addition to providing at least one conducting interconnect through said layers of thermal stress relieve material, said contact pads on said layers of thermal stress relieve material having been connected to at least one of said conducting interconnect through said layers of thermal stress relieve material, said conducting interconnects having been connected to at least one of said points of electrical contact points provided on said circuit board using PCB technology or Build Up Board technology, said contact pads on said layers of thermal stress relieve material being points of electrical contact for said semiconductor devices.

44. The method of claim 43 wherein providing at least one contact pad on said created layers of thermal stress relieve material comprises steps of:
depositing a layer of conducting material over said created layer of thermal stress relieve material;
patterning said layer of conducting material, creating a pattern of interconnect lines on said created layer of thermal stress relieve material, exposing said thermal stress relieve material;
depositing a layer of dielectric over said pattern of interconnect lines, including said exposed thermal stress relieve material;
depositing a solder mask over said layer of dielectric; and
patterning said layer of dielectric, exposing an array of conductive pads in the layer of dielectric, said conductive pads having been connected to at least one of said points of electrical contact provided on said circuit board, said conductive pads further being points of electrical contact for said semiconductor devices.

45. The method of claim 44 with additional steps of:
positioning said semiconductor devices above said circuit board, said array of conductive pads in the layer of dielectric being aligned and in contact with said points of electrical contact of said semiconductor devices; and
connecting said array of conductive pads in the layer of dielectric with said points of electrical contact for said semiconductor devices by thermal reflow.

46. The method of claim 22 wherein said Build Up Board technology is interconnecting a first pattern of interconnect lines and contact pads to a second pattern of interconnect lines and contact pads, said first pattern of interconnect lines and contact pads being created on a BGA surface, comprising steps of:
providing a semiconductor surface having been provided with points of electrical contact;
creating a layer of thermal stress relieve material on said semiconductor surface;
creating vias in said layer of stress relieve material, said vias overlying said points of electrical contact provided in said semiconductor surface;
depositing a layer of conductive material on said layer of stress relieve material, including said vias, connecting said layer of conductive material to points of electrical contact provided in said semiconductor surface; and
patterning said layer of conductive material, creating a pattern of interconnect lines or contact pads, exposing said created layer of thermal stress relieve material.

47. The method of claim 46 wherein said semiconductor surface is the surface of a BGA substrate.

48. The method of claim 46 wherein said creation of vias comprises methods of lithographic etching or laser drilling.

49. The method of claim 46 wherein said Build Up Board technology is applied one time during said step of creating a layer of thermal stress relieve material on said semiconductor surface, creating a first layer of thermal stress relieve material on said semiconductor surface.

50. The method of claim 46 wherein said depositing a layer of conductive material comprises steps of electroless seeding followed by electroplating of said underlying layer of said thermal stress relieve material, said steps of electroless seeding followed by electroplating being performed after said creation of vias in said created layer of thermal stress relieve material.

51. The method of claim 46 with additional steps of:
depositing a layer of dielectric over said pattered layer of conductive material, including said exposed thermal stress relieve material;
depositing a solder mask over said layer of dielectric; and
patterning said layer of dielectric, exposing an array of conductive pads in the layer of dielectric, said conductive pads having been connected to at least one of said points of electrical contact provided on said circuit board, said conductive pads further being points of electrical contact for said semiconductor devices.

52. The method of claim 51 with additional steps of:
positioning said semiconductor devices above said circuit board, said array of conductive pads in the layer of dielectric being aligned and in contact with said points of electrical contact of said semiconductor devices; and
connecting said array of conductive pads in the layer of dielectric with said points of electrical contact for said semiconductor devices by thermal reflow.

* * * * *